United States Patent [19]

Chesnut et al.

[11] Patent Number: 4,811,168

[45] Date of Patent: Mar. 7, 1989

[54] HOUSING AND CONNECTOR APPARATUS FOR ELECTRONIC CIRCUIT

[76] Inventors: Milton L. Chesnut, 1404 Deer Run, San Antonio, Tex. 78232; Alfred A. Schroeder, 2811 Whisper Fawn, San Antonio, Tex. 78230; Richard O. Norman, 4246 Gate Crest, San Antonio, Tex. 78217

[21] Appl. No.: 124,157

[22] Filed: Nov. 23, 1987

[51] Int. Cl.⁴ ............................................ H05K 7/12
[52] U.S. Cl. ................................... 361/399; 361/395; 361/426; 439/76
[58] Field of Search .......................... 439/67, 76, 77; 174/52 R; 361/380, 395, 399, 400, 413, 426, 428

[56] References Cited

U.S. PATENT DOCUMENTS

| 4,420,794 | 12/1983 | Anderson | 361/380 |
|-----------|---------|----------|---------|
| 4,459,640 | 7/1984 | Lasasiewicz | 361/399 |
| 4,679,728 | 7/1987 | Gregory | 361/395 |
| 4,729,740 | 3/1988 | Crowe | 439/76 |

Primary Examiner—G. P. Tolin

[57] ABSTRACT

An apparatus for housing an electronic circuit mounted on a printed circuit board which provides means for connecting electrical cables to the electronic circuit. The apparatus provides environmental protection to the electronic circuit and cable terminals. Additionally, the electronic circuit may be easily disconnected and removed without disturbing the cable connections.

5 Claims, 2 Drawing Sheets

HOUSING AND CONNECTOR APPARATUS FOR ELECTRONIC CIRCUIT

BACKGROUND OF THE INVENTION

The present invention relates generally to an apparatus for housing an electronic circuit and providing a means for connecting external inputs and outputs to that circuit. It is particularly suited, however, for housing an electronic ice control device used to maintain water or other liquids at a freezing temperature.

Cooling apparatus used for cooling beverages to a desired temperature typically circulate the beverage through coils immersed in water or other liquid which is kept at a freezing temperature. Some portion of the water or other liquid is allowed to freeze to a solid form in order to provide a heat sink for cooling the beverage. The frozen liquid is referred to as an ice bank.

Ice bank control devices utilize means for sensing the presence of ice and controlling the operation of a cooling apparatus accordingly. An ice bank is thereby allowed to grow to a predetermined size. Conventional ice bank control devices have generally been of the mechanical type. These devices use a capillary tube containing a solution which freezes when the tube is surrounded by ice. The expanding frozen solution within the capillary tube then compresses a diaphragm which operates an electrical switch. The electrical switch serves to turn a cooling compressor on or off and, thereby, controls the extent of ice formation.

More modern ice bank control devices, however, utilize electronic sensing means to determine the presence of ice. These devices utilize electrodes to carry current into the liquid and thence to ground. When a liquid undergoes a phase transformation into the solid form, its electrical resistance increases. If a constant current source is used to feed current to the sensing electrode, the presence or absence of ice surrounding the electrode may be detected by measuring the potential drop to ground at the electrode. Other electronic means can then be used to switch power on or off to the cooling compressor.

Electronic ice bank control devices present a number of advantages over their mechanical counterparts including lower cost and greater reliability. Also, since electronic devices measure the phase change directly rather than indirectly by measuring temperature, their operation is not affected by changes in the freezing point of the water caused by the addition of solutes.

Therefore, with the advent of electronic ice bank control devices, there has developed a need for a specialized packaging and connecting apparatus. It is an object of the present invention to provide a housing for the electronic control circuitry which will serve to protect the electronic components and electrically conductive surfaces from contact with water.

It is a further object of the present invention to provide a means for easily removing and replacing a printed circuit board upon which the elements of the electronic control circuit are mounted. As all electronic components are destined to fail at some time or other, it is desirable that removal and replacement be accomplished with a minimum of time and effort in order to lower service costs. Much time and effort can be saved by minimizing the number of electrical and mechanical connections which must be severed before the electronic circuitry can be removed. Accordingly, it is an object of the present invention to provide a connecting means for the printed circuit board containing the electronic circuitry which allows the removal of the printed circuit board without affecting power or sensor connections.

It is a still further object of the present invention to provide a means integral to the housing which allows the state of the final control output of the electronic circuitry to be observed. The final control output is invariably a contact closure, and it is desirable for the state of the contact to be observable without removing the housing or using a voltmeter at the output terminals. For example, when servicing the entire cooling apparatus, it is necessary to determine if the electronic control circuitry is operating properly independent of the operation of the compressor.

SUMMARY OF THE INVENTION

The apparatus that is the present invention basically comprises two housings. The first houses the electronic printed circuit board, while the second houses the terminals and connections for the power and sensor cables. The circuit board housing is designed to be fitted on top of the terminal housing and secured by a single screw. In this position, flat pins attached to the printed circuit board are inserted into specially designed slots of the terminal housing which provides the electrical connection between the printed circuit board and the cable terminations. The apparatus provides a unique means for connecting the flat pins to the terminals which provides both a secure mechanical connection as well as a low resistance electrical connection.

Cables enter the terminal housing through slots. Each cable is bent into an S-shape by ridges in the terminal housing before attaching to a screw-type terminal. The bending of the cable by the ridges helps to prevent the cable from being inadvertently pulled loose from its terminal connection.

When the circuit board housing is mounted atop the terminal housing, the terminal housing is partially fit into the circuit board housing. The overlapping portion of the circuit board housing protects from the environment the flat pins of the printed circuit board as they insert into the slots of the terminal housing. In the preferred embodiment of the present invention, where it is used to house the electronic control circuitry of an ice bank cooling system, this feature prevents accidental splashes of water from reaching the flat pins of the printed circuit board or the cable terminals.

On the top of the circuit board housing is small, circular-shaped lens which receives and concentrates light from a light-emitting element of the printed circuit board. In the preferred embodiment of the present invention, a lamp is mounted on the printed circuit board and electrically connected in series with the contacts controlling the operation of the compressor. This feature enables a user of the present invention to monitor the state of the contacts, and, hence, the operation of the control circuitry, by observing the state of the lamp through the lens mounted atop the circuit board housing. Thus, the operation of the control circuitry may be monitored independently from the operation of the compressor without disconnecting the printed circuit board.

These and other objects, features and advantages of the invention will become evident in light of the following detailed description, viewed in conjunction with the referenced drawings, of the preferred embodiment of the present invention. The foregoing and following description of the invention is for exemplary purposes only. The true spirit and scope of the invention is set forth in the appended claims.

DETAILED DESCRIPTION OF THE INVENTION

Figure 1:
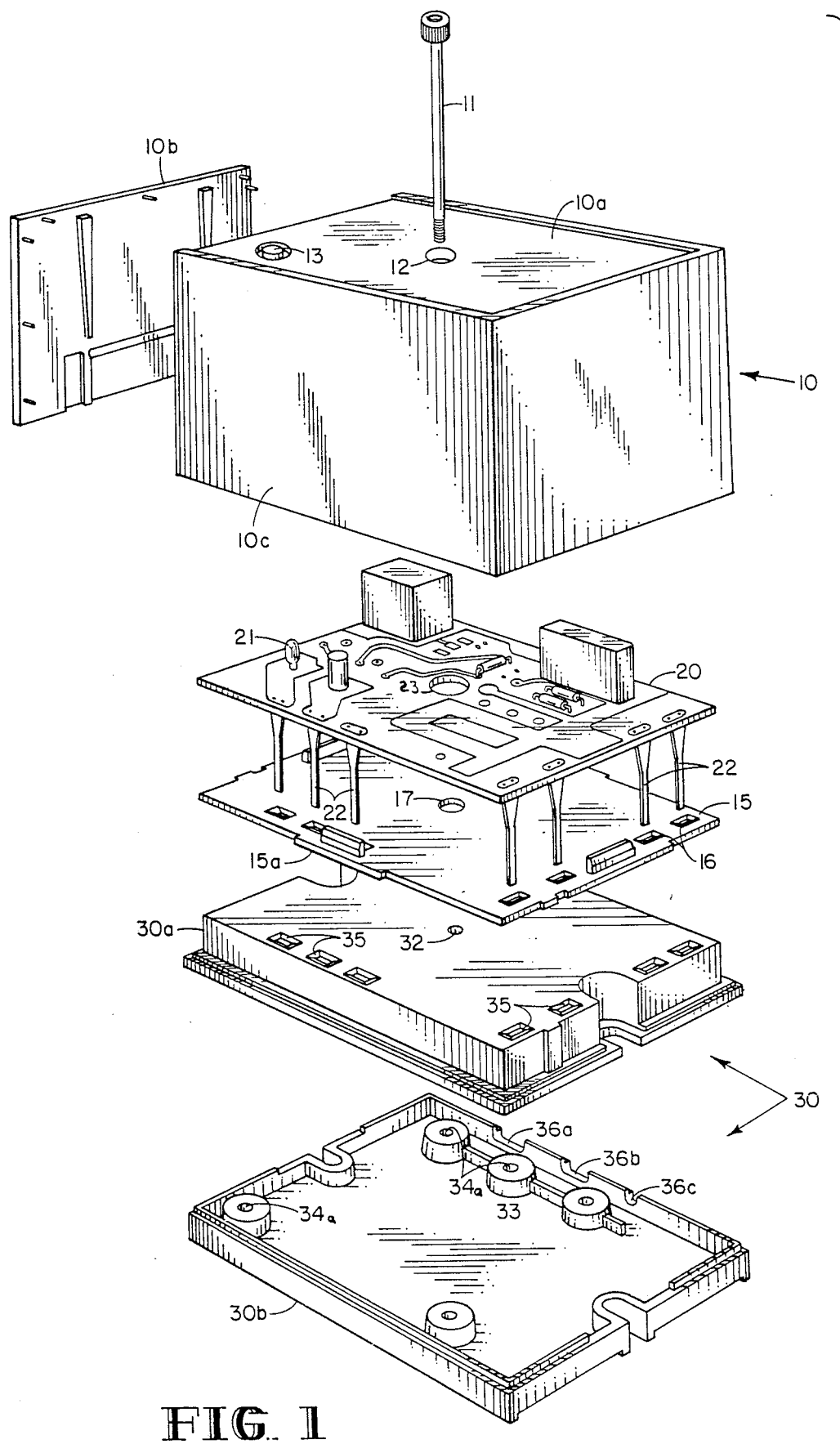
FIG. 1 is an exploded view of the entire apparatus.
Figure 2:
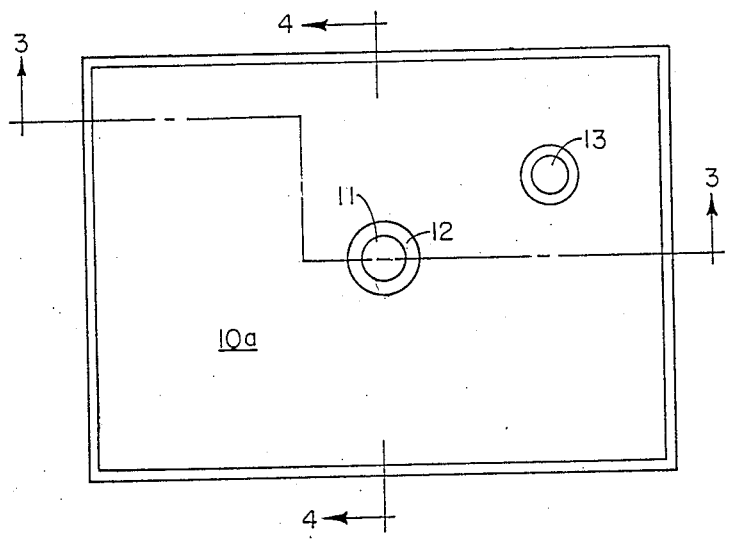
FIG. 2 is a view looking downward on the top planar member of the circuit board housing and showing the lines of section which correspond to FIG. 3 and FIG. 4.
Figure 4:
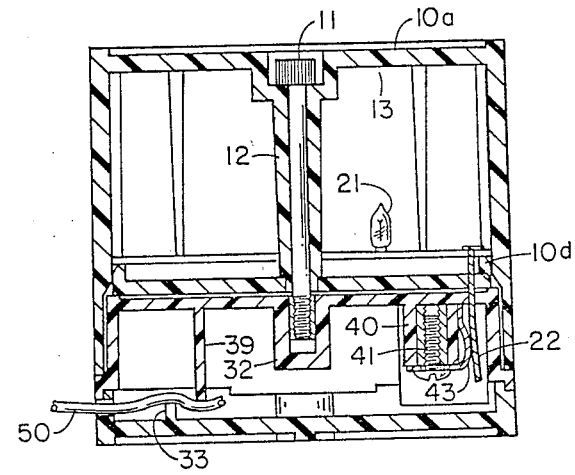
FIG. 4 is a cross-section of the apparatus along the line labeled 4 in FIG. 2.

Referring to FIG. 1, there is shown circuit board housing 10. Circuit board housing 10 is a generally rectangular box having five planar members comprising a top 10a, end members 10b, side members 10c, and open at the bottom. Printed circuit board 20 is mounted atop circuit board support plate 15. Printed circuit board 20 is electrically connected to power and sensor cable terminations by means of flat pins 22. Flat pins 22 insert into slots 16 of circuit board support plate 15. A tab 15a on each side of circuit board support plate 15 inserts into a corresponding slot 10d of circuit board housing side member 10c when circuit board support plate 15 is inserted into circuit board housing 10, as shown in FIG. 4. One of end members 10b of circuit board housing 10 is held to the rest of the housing by means of tacks or adhesive. One of end members 10b is, thus, removable which enables insertion of circuit board support plate 15 and printed circuit board 20.

Terminal housing 30 comprises an upper portion 30a and a base plate 30b. When upper portion 30a and base plate 30b are fitted together, a housing is formed which receives cables 50 through cable slots 36a, 36b, and 36c. Three cable slots are shown in this preferred embodiment for receiving a power in, power out, and a single sensor cable. The wires of cables 50 attach to ribbon conductors 43 by means of terminal screws 41. As shown in FIG. 4, cable 50 is bent into an S-shape by ridge 33 of base plate 30b and ridge 39 of upper portion 30a. This helps to prevent cable 50 from being inadvertently pulled loose from terminal screws 41.

Figure 3:
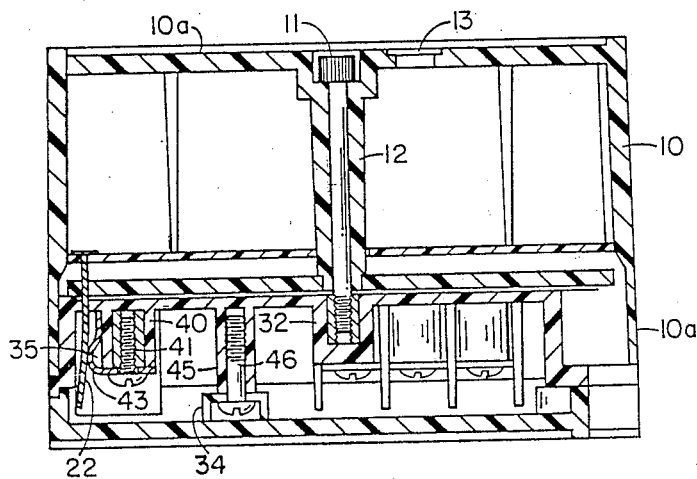
FIG. 3 is a cross-section of the apparatus along the lines labeled 3 in FIG. 2.

For each flat pin 22 of printed circuit board 20, there is a corresponding ribbon conductor 43, terminal screw 41, and terminal screw post 40. Terminal screws 41 are threadably engaged in terminal screw posts 40 of upper portion 30a as shown in FIG. 3 and FIG. 4. For each terminal screw post 40 in upper portion 30a, there is a slot 35 located adjacently. As shown in FIG. 3 and FIG. 4, ribbon conductors 43 are located within each slot 35 having an extension connected to each terminal screw post 40. A hole through the extension of ribbon conductor 43 allows passage of terminal screw 41 as it secures a wire of one of cables 50 to ribbon conductor 43 and terminal screw post 40. As flat pin 22 is inserted into slot 35, ribbon conductor 43 is deformed so as to exert a holding force against pin 22. The deformation of ribbon conductor 43 is such that it becomes slightly flattened which results in a large area of electrical contact between pin 22 and ribbon conductor 43.

A plurality of holding screws 46 secure base plate 30b to upper portion 30a. Holding screws 46 are inserted through holes 34a located within cup-like depressions 34 of base plate 30b as shown in FIG. 3. When upper portion 30a is mounted atop base plate 30b, cup-like depression 34 is positioned flush against holding screw post 45 of upper portion 30a. As shown in FIG. 3, holding screws 46 threadably engage holding screw posts 45.

After printed circuit board 20 and circuit board support plate 15 and mounted within circuit board housing 10, circuit board housing 10 is mounted atop terminal housing 30. Flat pins 22 of printed circuit board 20 engage slots 35 of terminal housing 30. Thus, in the completely assembled position, printed circuit board 20 is electrically connected to the appropriate terminals in terminal housing 30. Circuit board housing 10 is secured to terminal housing 30 by means of a single screw 11 which threadably engages a hole 32 in upper portion 30a as shown in FIG. 1. Screw 11 inserts into screw post 12 of top planar member 10a of circuit board housing 10. Screw post 12 passes successively through hole 23 in printed circuit board 20, and hole 17 in circuit board support plate 15. Thus, by removing a single screw, printed circuit board 20 may be disconnected from the rest of the unit without disturbing the cable connections within terminal housing 30.

Also located on the top planar member 10a of circuit board housing 10 is a lens 13 as shown in FIG. 1. Lens 13 is aligned with a lamp 21 of printed circuit board 20. The light emitted by lamp 21 is gathered and transmitted by lens 13. Lamp 21 may be installed so as to light when any appropriate status of printed circuit board 20 occurs. In the preferred embodiment, however, lamp 21 is connected in series with the output contacts which serve to turn on the compressor of the ice bank cooling system. Thus, an operator may easily determine whether the circuitry of printed circuit board 20 is operating properly independently of the operation of the compressor.

Although the invention has been described in conjunction with the foregoing specific embodiment, many alternatives, variations and modifications are apparent to those of ordinary skill in the art. Those alternatives, variations and modifications are intended to fall within the spirit and scope of the appended claims.

What is claimed is:

1. An apparatus for housing an electronic circuit mounted on a printed circuit board and providing means for connecting cables to said circuit, comprising:
    a circuit board housing having a top and four sides and being open at the bottom;
    means mounting said printed circuit board within said circuit board housing;
    a plurality of flat pin conductors attached to terminals of said printed circuit board;
    a terminal housing closing the opening in the bottom of said circuit board housing by being inserted therein so that said terminal housing is overlapped by the walls of said circuit board housing, and comprising a base plate and an upper portion, the latter having a plurality of slots which contain said flat pin conductors and a plurality of openings in said terminal housing for receiving electrical cables; and
    means in said terminal housing for electrically connecting cables to said flat pin conductors within said terminal housing;
    terminal housing further comprises two ridges within said terminal housing on the base plate and upper portion, respectively, oriented transversely to the longitudinal axis of a received electrical cable for bending electrical cables received through said openings into an S-shape.

2. The apparatus of claim 1 wherein said circuit board housing further comprises a lens mounted on the top of said circuit board housing for transmitting light emitted by a lamp mounted on a printed circuit board.

3. The apparatus of claim 1 further comprising a screw insertable through a hole in the top of said circuit board housing and threadably engaging a hole in the top of said upper portion of said terminal housing so as to hold said terminal housing within said circuit board housing.

4. The apparatus of claim I wherein said means for electrically connecting said flat pin conductors to cables further comprises:
- a plurality of screw-type terminals within said terminal housing; and
- a plurality of ribbon-type conductors mounted within said slots and electrically connected to said screw-type terminals, said ribbon-type conductors being of an arcuate shape which is straightened when said flat pin conductors are inserted into said slots so as to increase the surface area of contact between said flat pin conductor and said ribbon-type conductors and exert a holding force on said flat pin conductor.

5. An apparatus for housing an electronic circuit mounted on a printed circuit board and providing means for connecting cables to said circuit, comprising:
- a circuit board housing having a top and four sides and being open at the bottom;
- means mounting said printed circuit board within said circuit board housing;
- a plurality of flat pin conductors attached to terminals of said printed circuit board
- a terminal housing closing the opening in the bottom of said circuit board housing by being inserted therein so that said terminal housing is overlapping by the walls of said circuit board housing, and comprising a base plate and an upper portion, the latter having a plurality of slots which contain said flat pin conductors and a plurality of openings in said terminal housing for receiving electrical cables; and means in said terminal housing for electrically connecting cables to said flat pin conductors within said terminal housing; wherein said means for electrically connecting said flat pin conductors to cables further comprises:
- a plurality of screw-type terminals within said terminal housing; and,
- a plurality of ribbon-type conductors mounted within said slots and electrically connected to said screw-type terminals, said ribbon-type conductors being of an arcuate shape which is straightened when said flat pin conductors are inserted into said slots so as to increase the surface area of contact between said flat pin conductor and said ribbon-type conductors and exert a holding force on said flat pin conductor.

* * * * *